United States Patent [19]
Yamagata

[11] Patent Number: 5,798,974
[45] Date of Patent: Aug. 25, 1998

[54] SEMICONDUCTOR MEMORY DEVICE REALIZING HIGH SPEED ACCESS AND LOW POWER CONSUMPTION WITH REDUNDANT CIRCUIT

[75] Inventor: Tadato Yamagata, Hyogo, Japan

[73] Assignee: Mitsubishi Denki Kabushiki Kaisha, Tokyo, Japan

[21] Appl. No.: 721,075

[22] Filed: Sep. 26, 1996

[30] Foreign Application Priority Data

May 15, 1996 [JP] Japan ..................... 8-119850

[51] Int. Cl.⁶ ..................... G11C 7/00; G11C 8/00
[52] U.S. Cl. ............... 365/200; 365/225.7; 365/194; 365/230.06; 365/230.08
[58] Field of Search ..................... 365/200, 225.7, 365/194, 230.06, 230.08

[56] References Cited

U.S. PATENT DOCUMENTS

| | | |
|---|---|---|
| 4,858,192 | 8/1989 | Tatsumi et al. .................... 365/200 |
| 4,905,192 | 2/1990 | Nogami et al. .................... 365/200 |
| 5,299,164 | 3/1994 | Takeuchi et al. .................. 365/200 |
| 5,343,429 | 8/1994 | Nakayama et al. ................. 365/200 |
| 5,383,156 | 1/1995 | Komatsu ........................... 365/200 |

Primary Examiner—David C. Nelms
Assistant Examiner—Trong Phan
Attorney, Agent, or Firm—Lowe, Price, LeBlanc & Becker

[57] ABSTRACT

If a row (column) redundant circuit is not used, a comparison between a defective address and an internal address is not performed in a row (column) fuse programming portion in accordance with a signal output from a circuit for indicating if a row (column) redundant circuit is to be used or not. A comparison outcome signal which is generated when these addresses do not match each other is to be output from the row (column) fuse programming portion.

13 Claims, 20 Drawing Sheets

SEMICONDUCTOR MEMORY DEVICE REALIZING HIGH SPEED ACCESS AND LOW POWER CONSUMPTION WITH REDUNDANT CIRCUIT

BACKGROUND OF THE INVENTION

1. Field of the Invention

The present invention relates to a semiconductor memory device, and more particularly, to a semiconductor memory device provided with a redundant circuit.

2. Description of the Background Art

FIG. 19 shows a structure of a semiconductor memory device provided with a conventional row-related redundant circuit. As illustrated in FIG. 19, the semiconductor memory device having a redundant circuit is generally provided with a fuse programming circuit for programming a defective address by the fuse blowing. And this semiconductor memory device includes: address buffer 10 for buffering an external address signal and generating an internal row address signal RowAdd; control signal generating circuit 263 which externally inputs an external row address strobe signal ext. $\overline{RAS}$, an external write enable signal ext. $\overline{WE}$ and the like to generate an internal control signal; internal address activation signal generating circuit 11 which generates an internal address activation signal depending on the internal control signal input from control signal generating circuit 263, supplies it to address buffer 10 which takes in an external address signal, and outputs decoder activation signal $\phi$ to delay circuit 8; and sense amplifier activation signal generating circuit 9 for receiving decoder activation signal $\phi$ and generating a signal to activate a sense amplifier. (cf. Page 15, lines 3–12). A row fuse programming circuit 1, for example, compares an input row address with the programmed defective row address, then outputs a signal SPA which indicates whether a normal word line WL or a spare word line SWL is to be activated depending on the outcome of the comparison. After signal SPA output from row fuse programming circuit 1 and a signal NEA generated according to SPA in a row decoder control circuit 2 constituted by an NOR circuit are determined, a decoder activation signal $\phi$ of high level is supplied to a row decoder 4 or a spare row decoder 6, then the selected word line WL or spare word line SWL is activated. Until the outcome of the comparison of the addresses is established in row fuse programming circuit 1, the high level decoder activation signal $\phi$ is delayed in a delay circuit 8.

FIG. 20 is a circuit diagram showing the structure of row fuse programming circuit 1. And FIG. 21 is a timing diagram showing the operation of the semiconductor memory device having the conventional row-related redundant circuit shown in FIG. 19. As shown in FIG. 20, row fuse programming circuit 1 is provided with a row address comparison portion 30. A defective address can be programmed by blowing either a fuse Fx or a fuse $\overline{F}_x$ (x=0–n) included in row address comparison portion 30. If there is no defective memory cell, any fuse is not blown. When row fuse programming circuit 1 is on stand-by as shown in FIG. 21(a), a precharge signal PR of low level generated in a precharge signal generating circuit (not shown) sets a P channel MOS transistor Q1 on and the supply voltage is applied to an output node N1 from a supply node Vcc, so that programming circuit 1 outputs signal SPA of high level. At this time, the level of output signal SPA becomes high if row addresses Ax, $\overline{A}_x$ (x=0–n) designated by an input internal row address signal RowAdd shown in FIG. 21(b) matches the previously programmed defective addresses, otherwise the level of output signal SPA becomes low as shown in FIG. 21(c) since an N channel MOS transistor Q2 is turned on to cause the discharge through the fuse.

As shown by FIG. 21(e), decoder activation signal $\phi$ is delayed for a delay time D by delay circuit 8 until the logic levels of signal SPA shown by FIG. 21(c) and signal NEA shown by FIG. 21(d) are both established, then activated to high level. Decoder activation signal $\phi$ accordingly activates the selected word line WL or spare word line SWL as shown in FIGS. 21(f) and 21(g), respectively.

FIG. 22 is a timing diagram showing a case in which delay time D in FIG. 21(e) is not sufficiently long as shown in FIG. 22(e). Because delay time D is not long as illustrated by FIG. 22(e), decoder activation signal $\phi$ is activated earlier. At this time, signal SPA has high level as shown by FIG. 22(c), so that all the spare word lines SWL will be activated by spare row decoder 6 as shown in FIG. 22(g) if selected or not. Therefore, decoder activation signal $\phi$ is delayed for appropriate time not to cause such a malfunction. Here the precharge signal PR, the internal row address signal RowAdd, the signal NEA and the normal word line WL shown in FIGS. 22(a), 22(b), 22(d) and 22(f), respectively, are related in the same way as those shown in FIGS. 21(a), 21(b), 21(d) and 21(f).

Although the semiconductor memory device provided with the redundant circuit as described above improves the yield, it still has a problem that activation of the word lines is delayed altogether.

SUMMARY OF THE INVENTION

An object of the present invention is to provide a semiconductor memory device in which the earlier activation of the word line is possible without comparing the internal address with the defective address, if the chip is of good quality with respective memory cells formed on the chip being free of any defect and there is no need of redundant circuit, resulting in the acceleration of the access speed.

A semiconductor memory device according to one aspect of the present invention includes: a plurality of memory cells storing data; a redundant circuit used in place of a defective memory cell, if any; a driver circuit for writing and reading data in the memory cell or the redundant circuit; a defective address storing circuit comparing a previously stored defective address corresponding to a defective memory cell with an address shown by an input address signal to generate a comparison outcome signal; and a cell state demonstrating circuit showing the redundant circuit should be used or not. The cell state demonstrating circuit deactivates the defective address storing circuit when there is no necessity of using the redundant circuit.

A principal advantage of the present invention is, therefore, the reduced power consumption in the defective address storing circuit of the semiconductor memory device having a redundant circuit since the defective address storing circuit is deactivated when use of the redundant circuit is not required.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
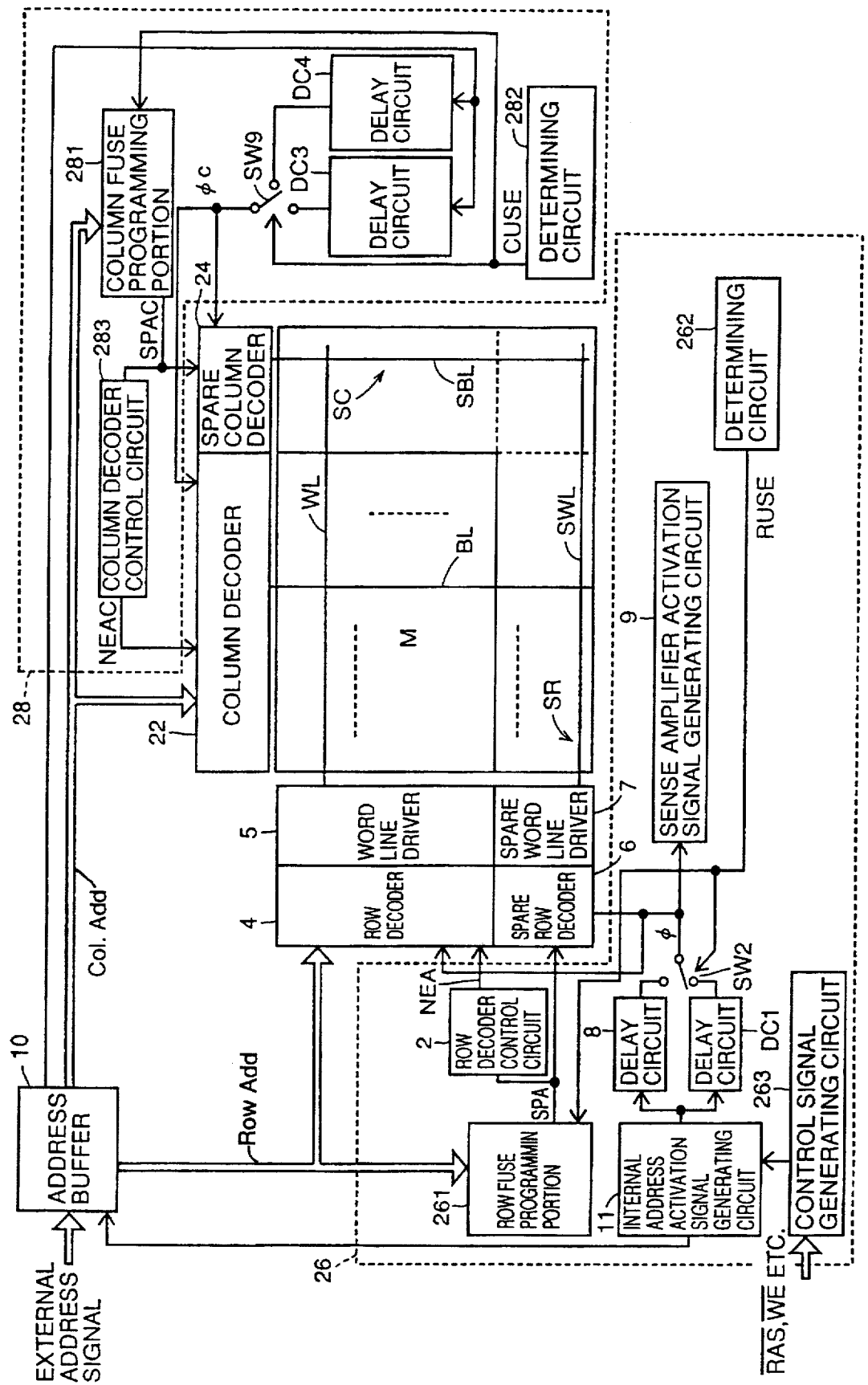
FIG. 1 is a block diagram showing the overall structure of a semiconductor memory device according to the embodiment of the present invention.

The embodiment of the present invention will be hereinafter described in detail referring to the drawings. It is noted that like reference characters denote the identical or the corresponding parts in the drawings.

FIG. 1 is a block diagram showing the overall structure of the semiconductor memory device according to the embodiment of the present invention. As illustrated in FIG. 1, the semiconductor memory device according to this embodiment includes: a memory M constituted by a plurality of memory cells; a row redundant circuit SR; a column redundant circuit SC; word lines WL and bit lines BL included in memory M; a spare word line SWL included in row redundant circuit SR; a spare bit line SBL included in column redundant circuit SC; a row decoder 4 and a word line driver 5 for driving word line WL; a spare row decoder 6 and a spare word line driver 7 for driving spare word line SWL; a column decoder 22 for driving bit line BL; a spare column decoder 24 for driving spare bit line SBL; an address buffer 10 inputting an external address signal and outputting an internal row address signal RowAdd and an internal column address signal Col.Add; a row-related decoder control portion 26 for the control of row decoder 4 and spare row decoder 6; and a column-related decoder control portion 28 for the control of column decoder 22 and spare column decoder 24.

Figure 2:
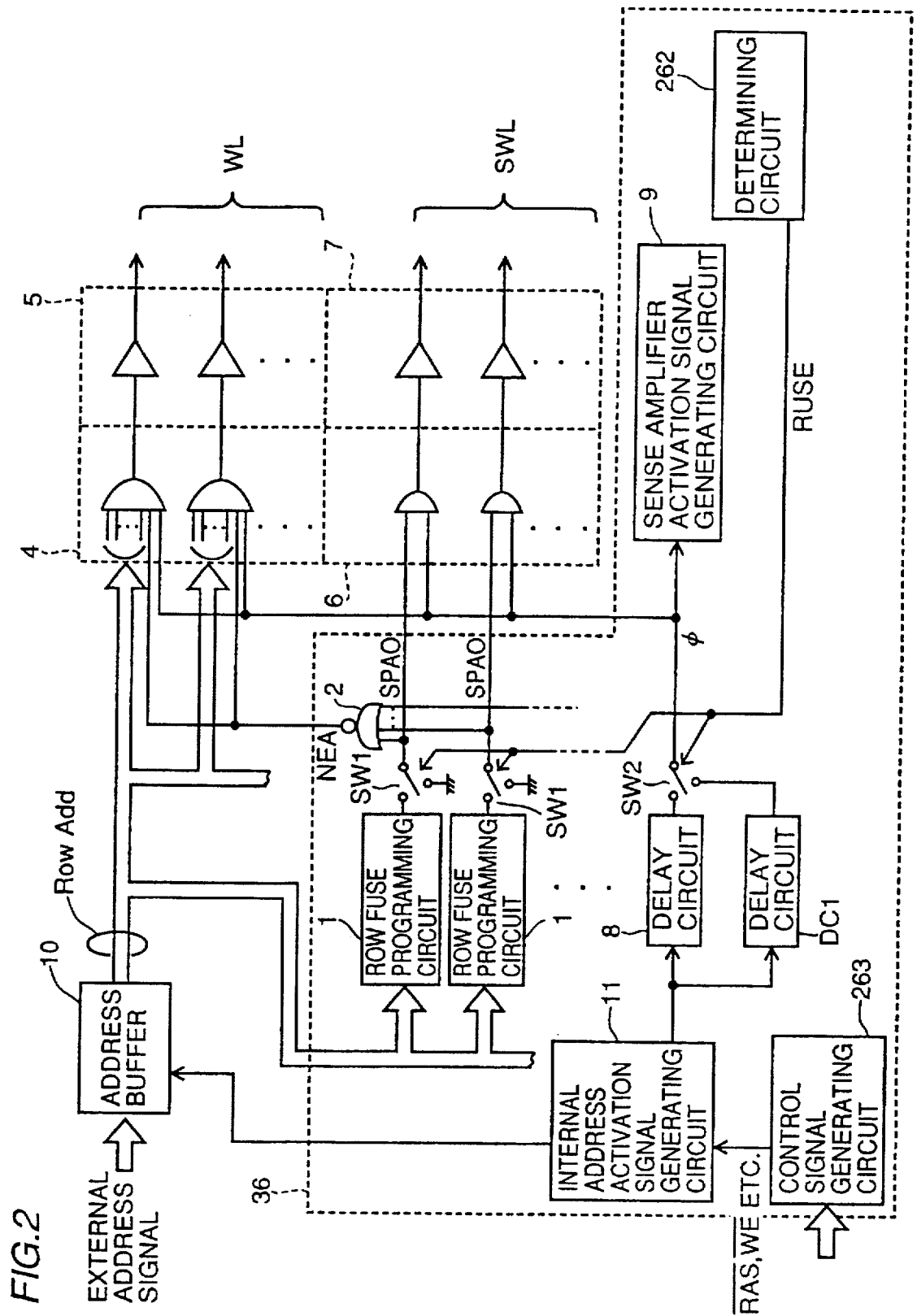
FIG. 2 shows a row-related decoder control portion structured differently from the row-related decoder control portion shown in FIG. 1.

FIG. 2 shows a row-related decoder control portion 36 structured differently from row-related decoder control portion 26 in FIG. 1.

Row-related decoder control portion 36 is provided with a row fuse programming circuit 1, a row decoder control circuit 2, a control signal generating circuit 263, an internal address activation signal generating circuit 11, a delay circuit 8, and a sense amplifier activation signal generating circuit 9, as well as switches SW1 and SW2, a delay circuit DC1 in which a delay time DT1 is set shorter than the delay time D in delay circuit 8, and a circuit for indicating whether the semiconductor memory device is required to use a row redundant circuit or not, hereinafter referred to as row-related determining circuit 262.

The switches SW1 and SW2 are controlled by a signal RUSE output from row-related determining circuit 262.

Figure 3:
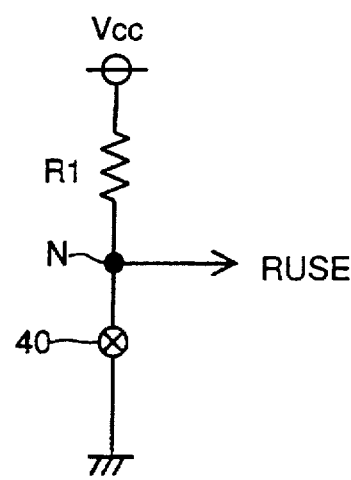
FIG. 3 is a circuit diagram showing one example of the row-related determining circuit shown in FIG. 2.

FIG. 3 is a circuit diagram showing one example of row-related determining circuit 262. As illustrated in FIG. 3, row-related determining circuit 262 includes a supply node Vcc, a high resistance R1 connected in series between supply node Vcc and a ground node, a fuse 40, and a node N. Fuse 40 is blown when row redundant circuit SR is used in the semiconductor memory device, and signal RUSE of high level is output from node N. On the other hand, when row redundant circuit SR is not used in the semiconductor memory device, fuse 40 is not blown and node N and the ground node are connected, so that signal RUSE of low level is output from node N.

Next the operation of the semiconductor memory device including row-related decoder control portion 36 will be described.

Figure 21:
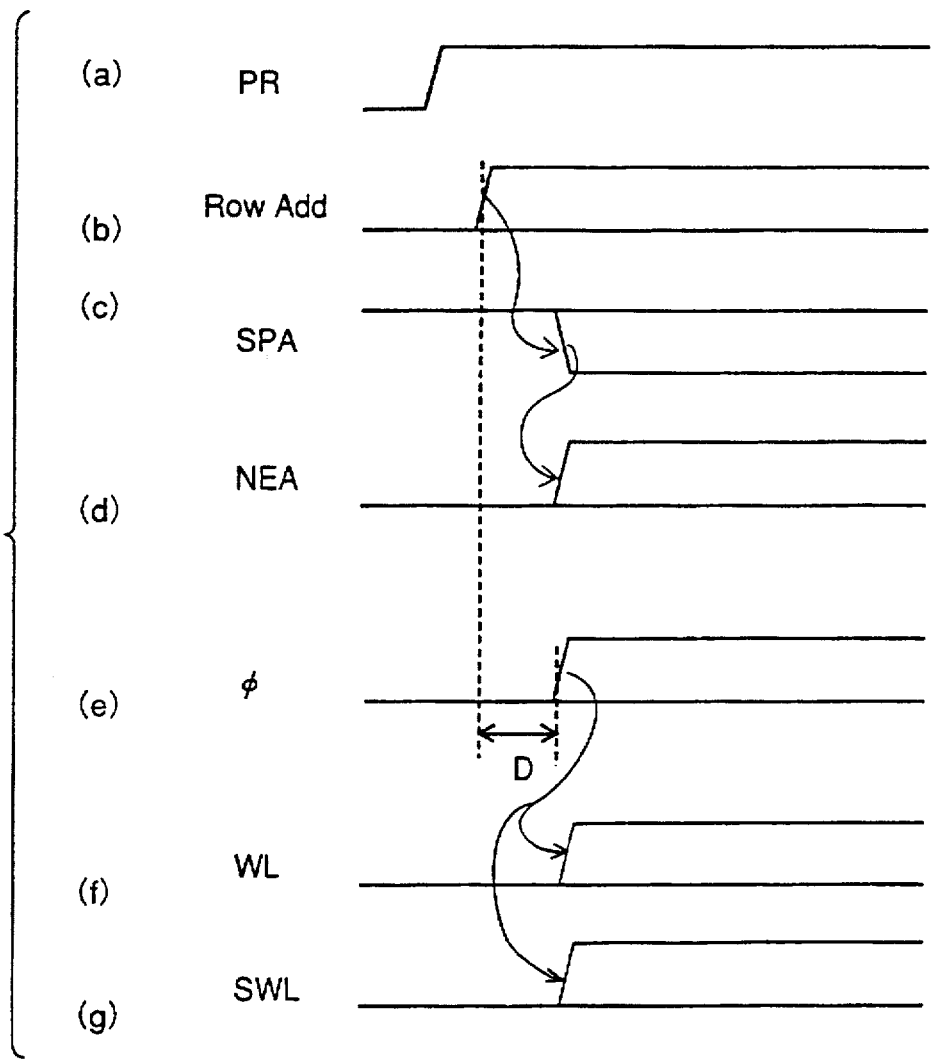
FIGS. 21(a)–21(g) are timing charts showing the operation of the semiconductor memory device in FIG. 19.
Figure 22:
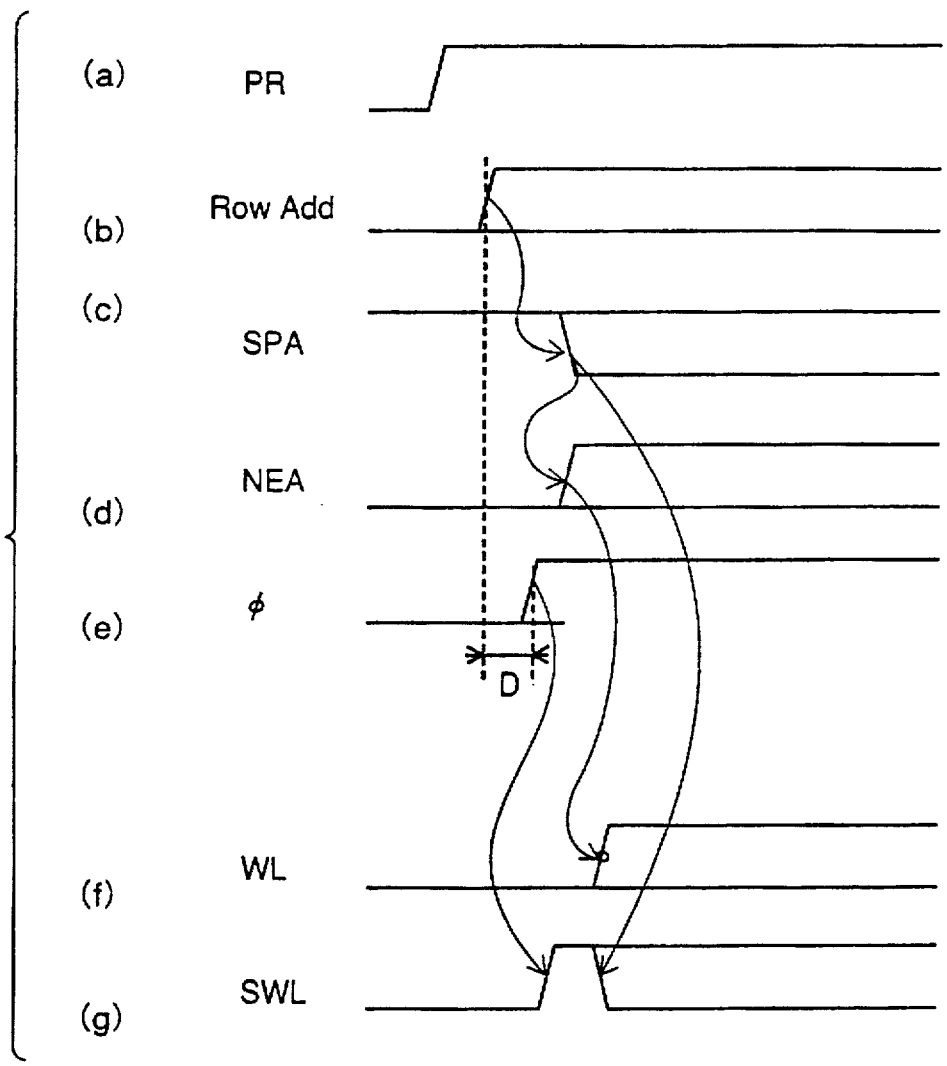
FIGS. 22(a)–22(g) are timing charts showing the operation of the semiconductor memory device in FIG. 19 when the delay time set by the delay circuit of FIG. 19 is not long.

If the semiconductor memory device uses row redundant circuit SR, switch SW1 connects row fuse programming circuit 1 with row decoder control circuit 2 and spare row decoder 6 in accordance with signal RUSE of high level output from row-related determining circuit 262, so that operation is similar to that of the conventional semiconductor memory device shown in the timing diagram of FIG. 21.

Figure 4:
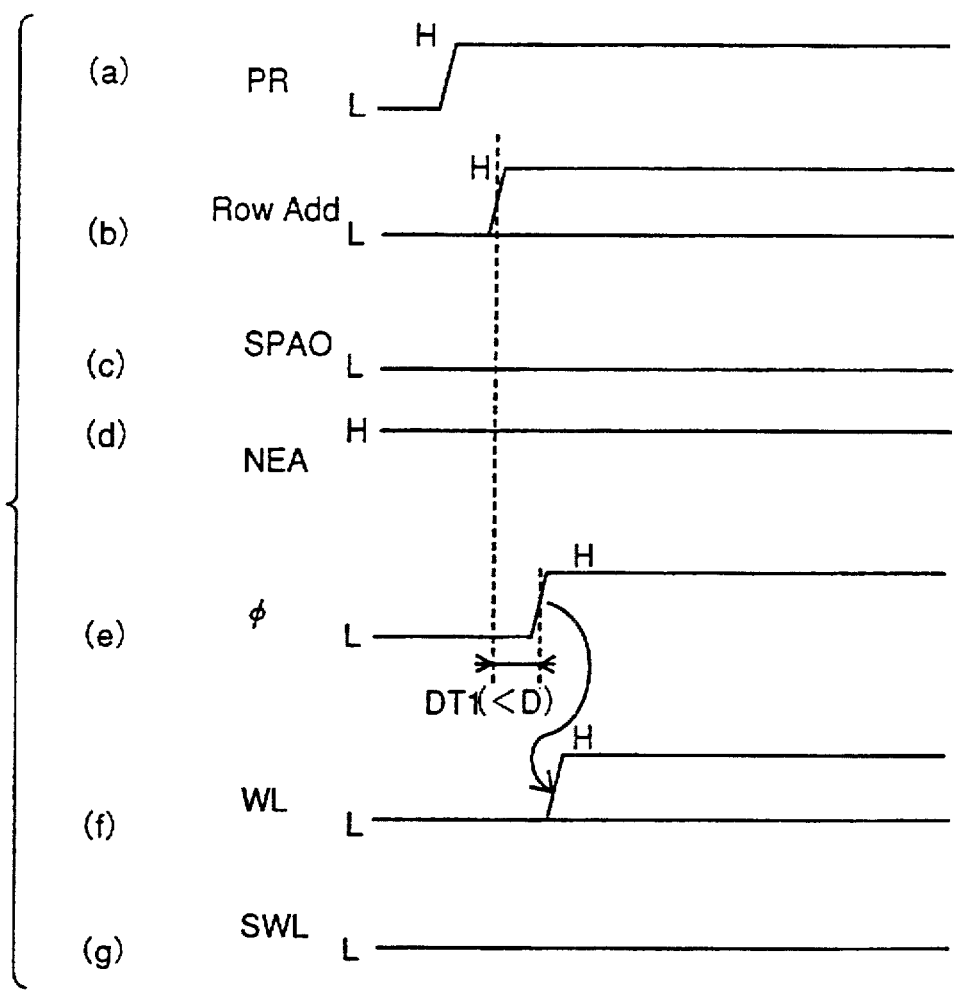
FIGS. 4(a)–4(g) are timing charts showing the operation of the semiconductor memory device provided with the row-related decoder control portion shown in FIG. 2.

The operation of the semiconductor memory device which does not use row redundant circuit SR is shown in the timing chart of FIG. 4. Because the activation of spare word line SWL is not necessary, as shown in FIG. 4 (g), signal RUSE of low level output from row-related determining circuit 262 switches switch SW1, and the logic level of a signal SPA0 output from row fuse programming circuit 1 attains low (L) as shown by FIG., 4(c). At this time, since only the low level signal is input to row decoder control circuit 2, the level of signal NEA output from row decoder control circuit 2 attains high (H) as shown by FIG. 4(d).

After precharge signal PR is activated as shown in FIG. 4(a), row decoder 4, receives internal row address signal RowAdd shown by FIG. 4(b), and waits for the activation of decoder activation signal φ. Decoder activation signal φ is delayed for the reduced delay time DT1 in delay circuit DC1 and thereafter activated, as shown by FIG. 4(e) because SW2 is switched in accordance with signal RUSE of low level output from row-related determining circuit 262. The acceleration of the access time is thus realized by the earlier activation of decoder activation signal φ to cause the earlier activation of word line WL as shown by FIG. 4(f).

Figure 5:
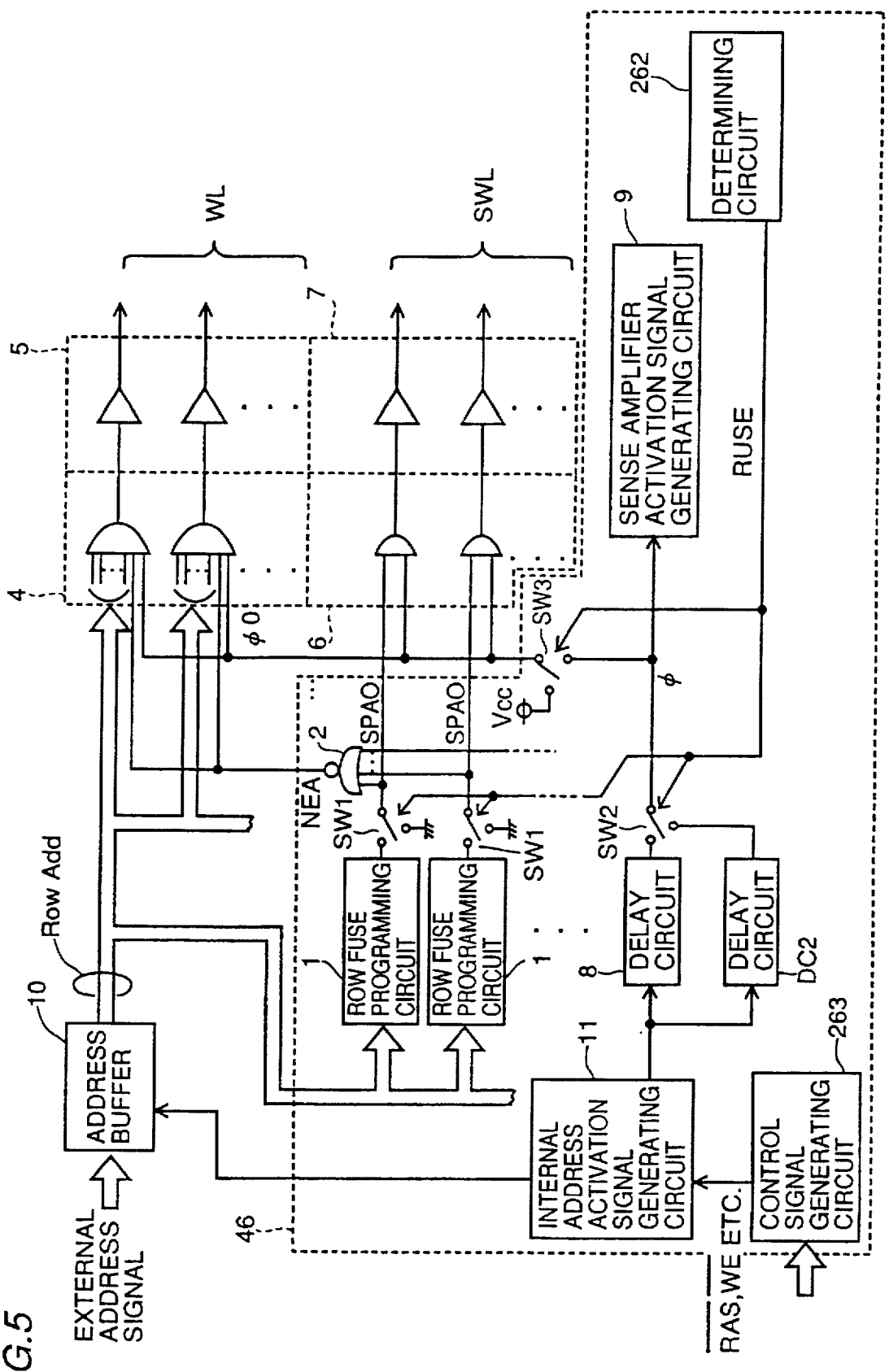
FIG. 5 shows another row-related decoder control portion structured differently from the row-related decoder control portion shown in FIG. 1.

FIG. 5 shows another row-related decoder control portion 46 structured differently from row-related decoder control portion 26 shown in FIG. 1. As can be seen in FIG. 5, row-related decoder control portion 46 has a structure similar to that of row-related decoder control portion 36 of FIG. 2, with a switch SW3 added thereto.

Switch SW3 is controlled by signal RUSE output from row-related determining circuit 262. When the semiconductor memory device uses row redundant circuit SR, it operates similarly to the conventional semiconductor memory device as shown in the timing chart of FIG. 21 because row decoder 4 and spare row decoder 6 are connected with delay circuit 8.

Figure 6:
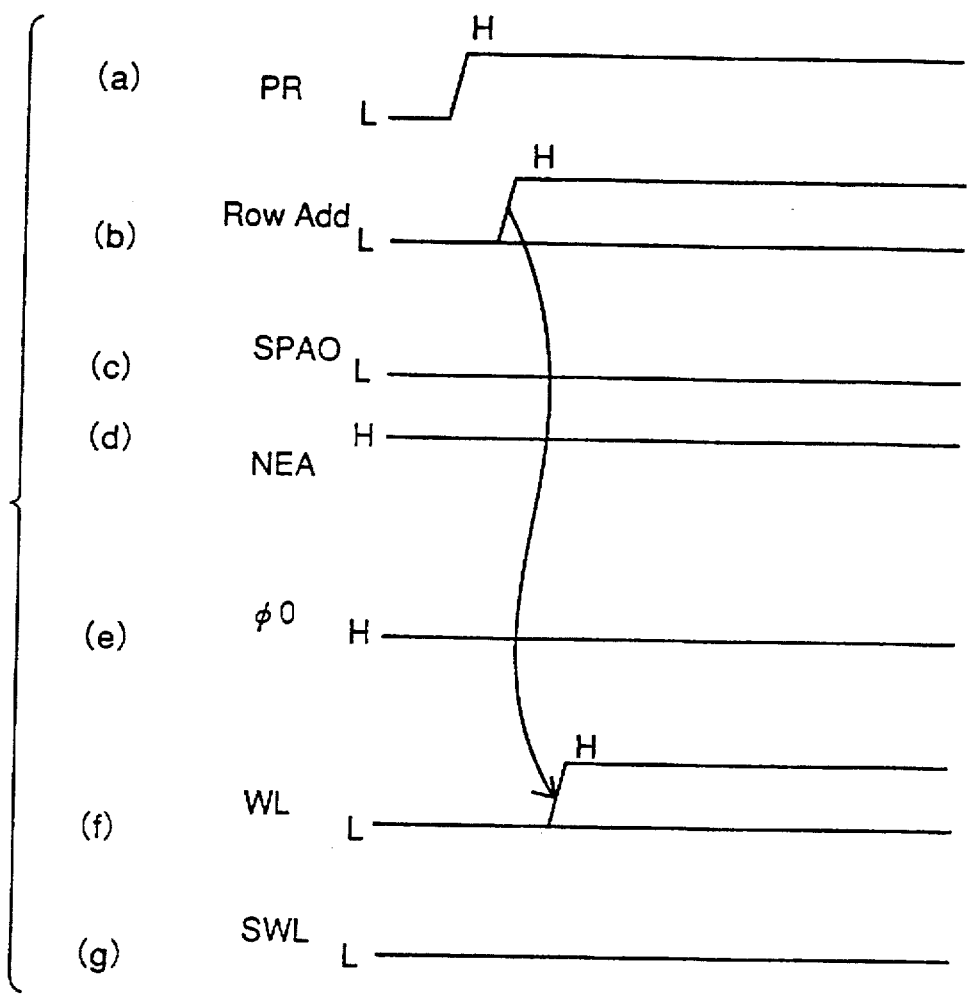
FIGS. 6(a)–6(g) are timing charts showing the operation of the semiconductor memory device provided with the row-related decoder control portion shown in FIG. 5.

The operation of the semiconductor memory device which does not use row redundant circuit SR is described following the timing chart of FIG. 6. SW3 is switched in accordance with signal RUSE of low level output from row-related determining circuit 262 so that row decoder 4 and spare row decoder 6 are connected with supply node Vcc. As shown by FIG. 6(e), the level of a signal φ0 supplied from switch SW3 to row decoder 4 and spare row decoder 6 is set high (H). In this case, internal row address signal RowAdd triggers the activation of word line WL as shown by (b) and (f) of FIG. 6, resulting in the acceleration of the data access compared with the conventional semiconductor memory device. Here the precharge signal PR, the signal SPAQ, the signal NEA and the spare word line SWL shown in FIGS. 6(a), 6(c), 6(d and 6(g), respectively, are related in the same way as those shown in FIGS. 4(a), 4(c), 4(d) and 4(g).

Delay time DT2 set in a delay circuit DC2 is determined considering the activation timing of the sense amplifier activation signal. It is noted that delay time DT2 is set shorter than delay time D set in delay circuit 8 when row redundant circuit SR is used, in order to cause an earlier activation of the sense amplifier in accordance with the earlier activation of word line WL.

Figure 7:
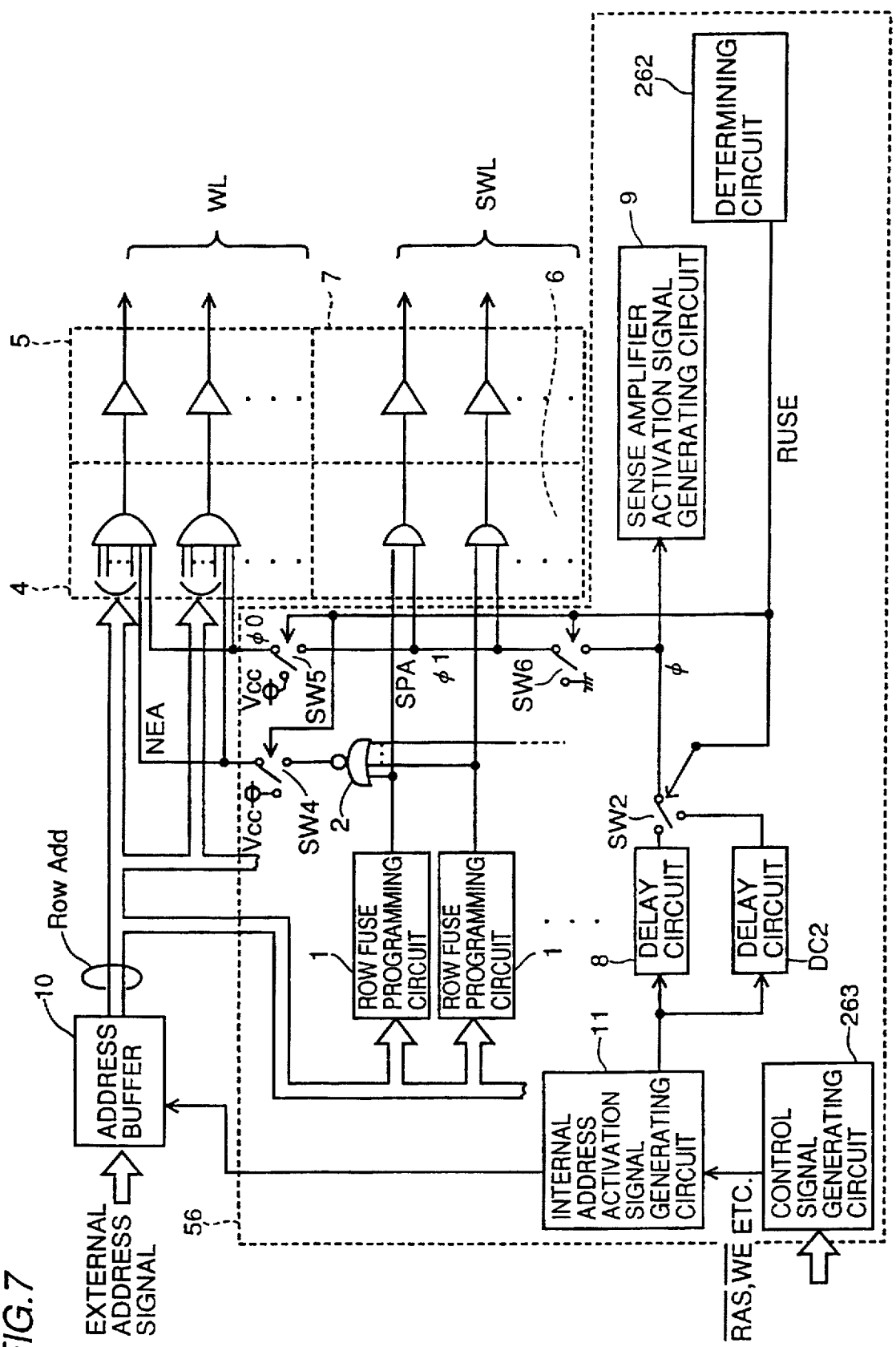
FIG. 7 shows still another row-related decoder control portion structured differently from the row-related decoder control portion shown in FIG. 1.

FIG. 7 shows still another row-related decoder control portion 56 structured differently from row-related decoder control portion 26 shown in FIG. 1. Row-related decoder control portion 56 has a structure similar to that of row-related decoder control portion 46 in FIG. 5 except that row fuse programming circuit 1 is directly connected to row decoder control circuit 2 and spare row decoder 6. Row-related decoder control portion 56 is further provided with a switch SW4 connected between row decoder control circuit 2 and row decoder 4, a switch SW6 connected between switch SW2 and spare row decoder 6/row decoder 4, and a switch SW5 connected between switch SW6 and row decoder 4.

Figure 8:
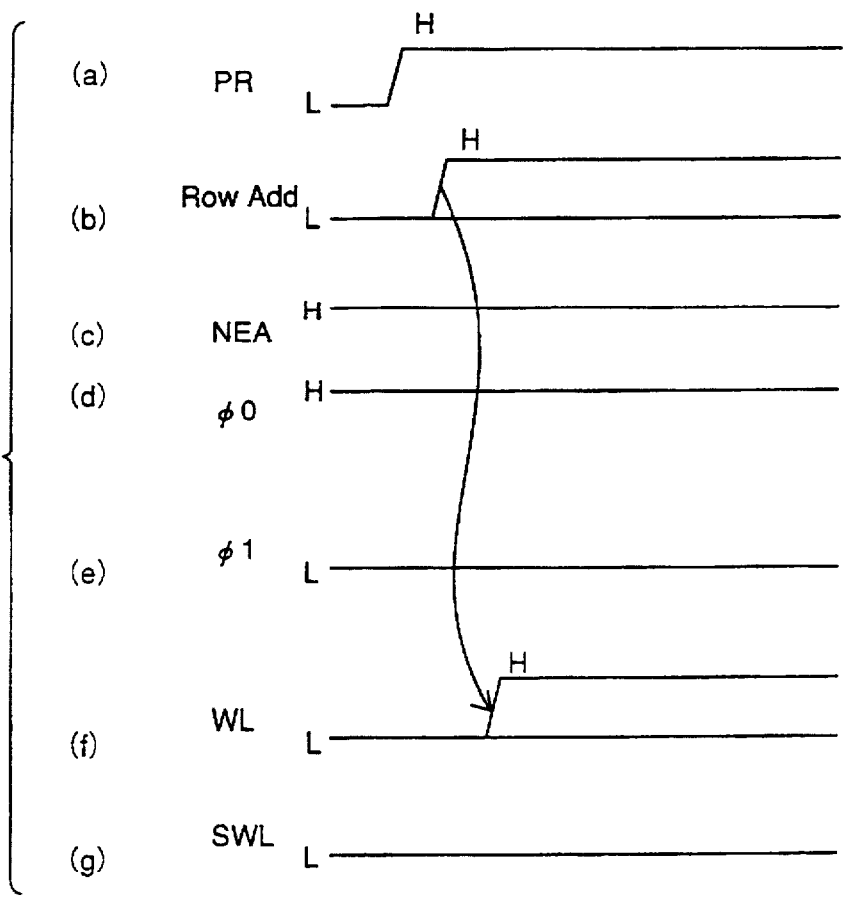
FIGS. 8(a)–8(g) are timing charts showing the operation of the semiconductor memory device provided with the row-related decoder control portion shown in FIG. 7.

The operation of row-related decoder control portion 56 is similar to that of the conventional semiconductor memory device when the row redundant circuit is used. The timing chart of FIG. 8 shows the operation of decoder control portion 56 when the row redundant circuit is not used. Signal RUSE of low level output from row-related determining circuit 262 causes switching of SW4, SW5, and SW6, so that the levels of signal NEA supplied to row decoder 4 and decoder activation signal φ0 attain high (H), and the level of signal φ1 supplied to spare row decoder 6 attains low (L) as shown by (c), (d) and (e) of FIG. 8. Therefore, the input of internal row address signal RowAdd to row decoder 4 after the activation of precharge signal PR shown in FIG. 8(g), immediately causes the activation of word line WL without waiting for the outcome of the address comparison in row fuse programming circuit 1 as shown by (b) and (f) of FIG. 8. Here the spare word line SWL is not activated as shown by FIG. 8(g) in this case.

However, row-related decoder control portions 36, 46 and 56 shown in FIGS. 2, 5 and 7 still have a problem that the power is wasted in row fuse programming circuit 1.

Figure 9:
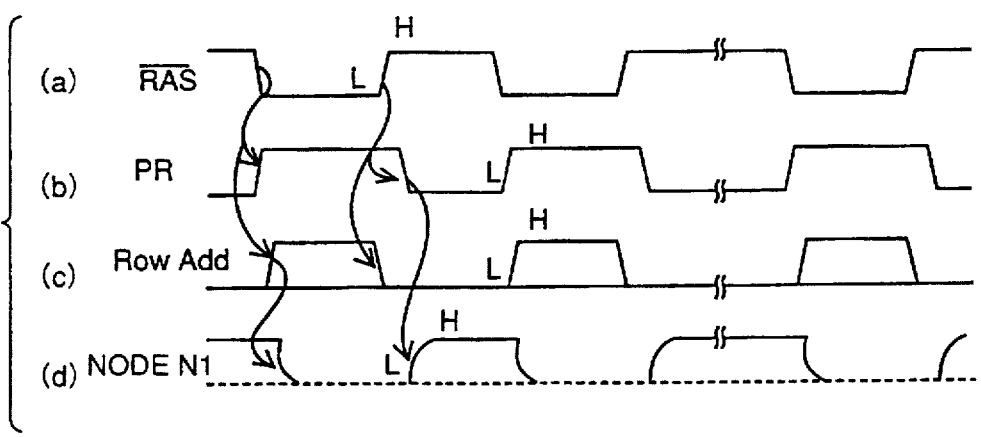
FIGS. 9(a)–9(d) are timing charts related to the power consumption in the row fuse programming circuit during the operation of the semiconductor memory device provided with the row-related decoder control portion shown in FIGS. 2, 5 and 7.
Figure 20:
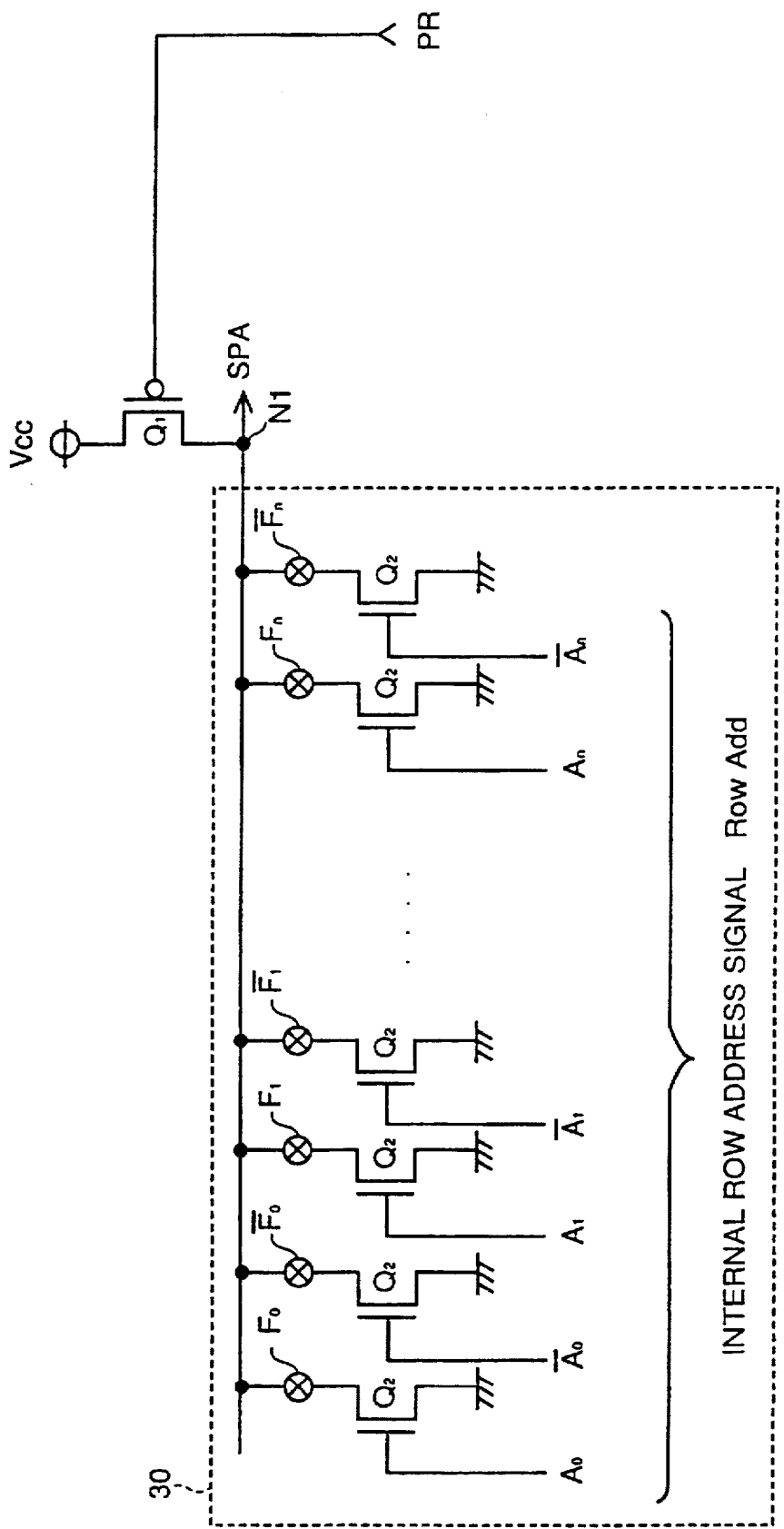
FIG. 20 is a circuit diagram showing the structure of the row fuse programming circuit shown in FIG. 19.

FIG. 9 is a timing chart for explaining the operation of row fuse programming circuit 1 with the specific circuit structure thereof illustrated in FIG. 20.

When there is no defective memory cell and therefore row redundant circuit SR is not used, none of fuses Fx, $\overline{Fx}$, (x=0-n) shown in FIG. 20 is blown. While the potential of node N1 is set to the supply potential when P channel MOS transistor Q1 is on and the supply voltage is attained from supply node Vcc, the potential of node N1 becomes the ground potential as shown in FIG. 7(d) every time internal row address signal RowAdd is periodically input as shown in FIG. 9(c) after the activation of row address strobe signal $\overline{RAS}$ and precharge signal PR shown in FIGS. 9(a) and 9(b) and one or more N channel MOS transistor Q2 turns on and the ground voltage is applied through the fuses. Row fuse programming circuit 1 therefore periodically repeats the charge/discharge at node N1, causing the extra power consumption.

The present invention, therefore, further aims at providing a semiconductor memory device preventing such wasteful power consumption therein.

Row-related decoder control portion 26 in FIG. 1 for achieving above object is hereinafter described.

Row-related decoder control portion 26 includes: a row fuse programming portion 261 connected with address buffer 10 for storing a defective row address corresponding to a defective memory cell and comparing the defective row address with the row address shown by internal row address signal RowAdd input from address buffer 10; row decoder control circuit 2 connected between row fuse programming portion 261 and row decoder 4 for determining whether it activates row decoder 4 or not; control signal generating circuit 263 which externally inputs an external row address strobe signal ext.$\overline{RAS}$, an external write enable signal ext.$\overline{WE}$ and the like to generate an internal control signal; and internal address activation signal generating circuit 11 which generates an internal address activation signal depending on the internal control signal input from control signal generating circuit 263, supplies it to address buffer 10 for making address buffer 10 take in an external address signal, and outputs decoder activation signal φ. Row-related decoder control portion 26 further includes: delay circuit 8 connected with internal address activation signal generating circuit 11 for delaying decoder activation signal φ generated in the circuit 11 for delay time D; delay circuit DC1 connected to internal address activation signal generating circuit 11 in parallel with delay circuit 8 for delaying decoder activation signal φ for delay time DT1 which is shorter than delay time D; row-related determining circuit 262 showing whether the semiconductor memory device is required to use row redundant circuit SR; switch SW2 connected with row decoder 4, spare row decoder 6 and sense amplifier activation signal generating circuit 9 for switching the delay of decoder activation signal φ in delay circuit 8 and the delay of the signal φ in delay circuit DC1 according to signal RUSE output from row-related determining circuit 262; and sense amplifier activation signal generating circuit 9 for generating a sense amplifier activation signal according to decoder activation signal φ supplied from switch SW2.

Figure 10:
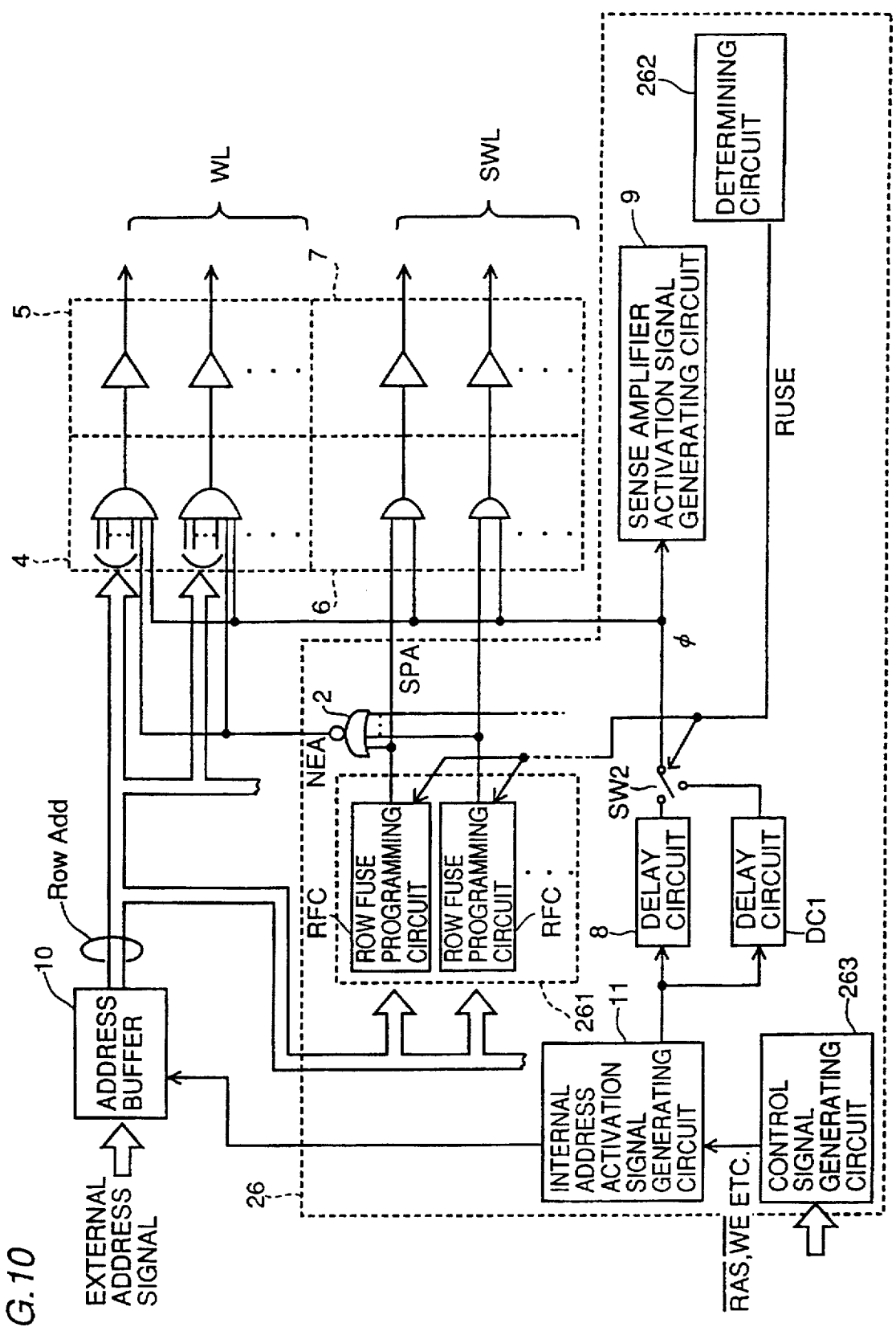
FIG. 10 shows the structure of the row-related decoder control portion shown in FIG. 1.

FIG. 10 shows the structure of row-related decoder control portion 26 in more detail.

As shown in FIG. 10, row fuse programming portion 261 includes a plurality of row fuse programming circuits RFC, and row decoder control circuit 2 is constituted by an NOR circuit. The structure of row-related determining circuit 262 is similar to that shown in FIG. 3.

Figure 11:
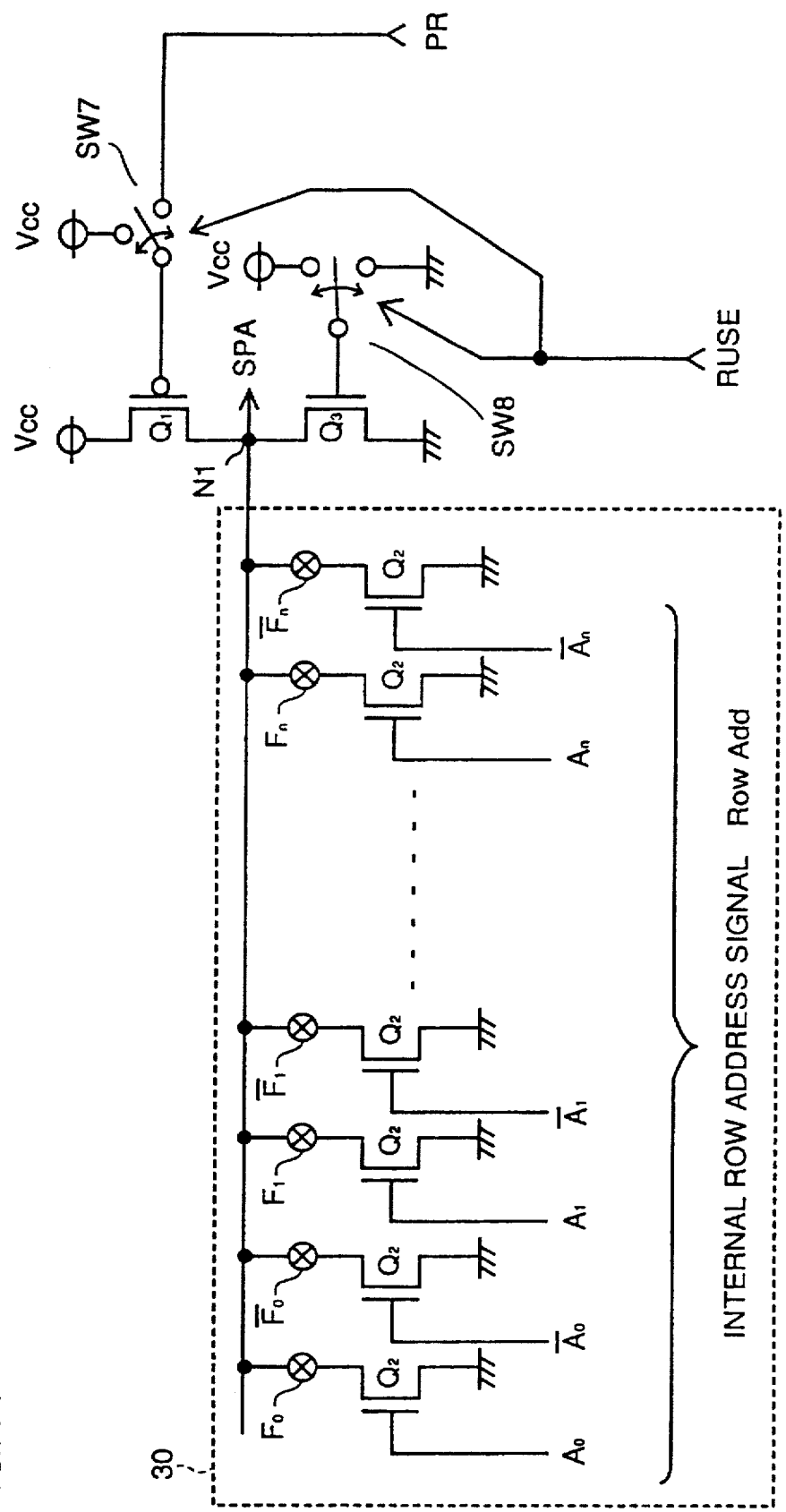
FIG. 11 is a circuit diagram showing the structure of the row fuse programming circuit shown in FIG. 10.

Next with reference to FIG. 11. FIG. 11 is a circuit diagram illustrating the specific structure of row fuse programming circuit RFC. As shown in FIG. 11, row fuse programming circuit RFC includes, as the conventional row fuse programming circuit 1, output node N1, row address comparison portion 30 for comparing a defective row address with an internal row address Ax, $\overline{Ax}$ (x=0–n) represented by the input internal row address signal RowAdd, supply node Vcc, and P channel MOS transistor Q1 with its source connected to supply node Vcc and its drain connected to output node N1. Row fuse programming circuit RFC further includes: a switch SW7 which supplies to the gate of P channel MOS transistor Q1, precharge signal PR generated in a precharge signal generating circuit (not shown) or the supply voltage applied from supply node Vcc according to signal RUSE output from row-related determining circuit 262; an N channel MOS transistor Q3 with its source connected to the ground node and its drain connected to output node N1; and a switch SW8 which supplies, to the gate of N channel MOS transistor, the supply voltage applied from the supply node or the ground voltage applied from the ground node according to signal RUSE output from row-related determining circuit 262.

The operation of row fuse programming circuit RFC is hereinafter explained. When row redundant circuit SR is used, SW7 is switched by signal RUSE of high level output from row-related determining circuit 262 to provide precharge signal PR to the gate of P channel MOS transistor Q1. SW8 is switched by signal RUSE output from row-related determining circuit 262 to provide the ground voltage to the gate of N channel MOS transistor Q3. Accordingly, P channel MOS transistor Q1 turns on and N channel MOS transistor Q3 turns off when row redundant circuit SR is used, so that RFC operates similarly to the conventional row fuse programming circuit shown in FIG. 20.

Figure 12:
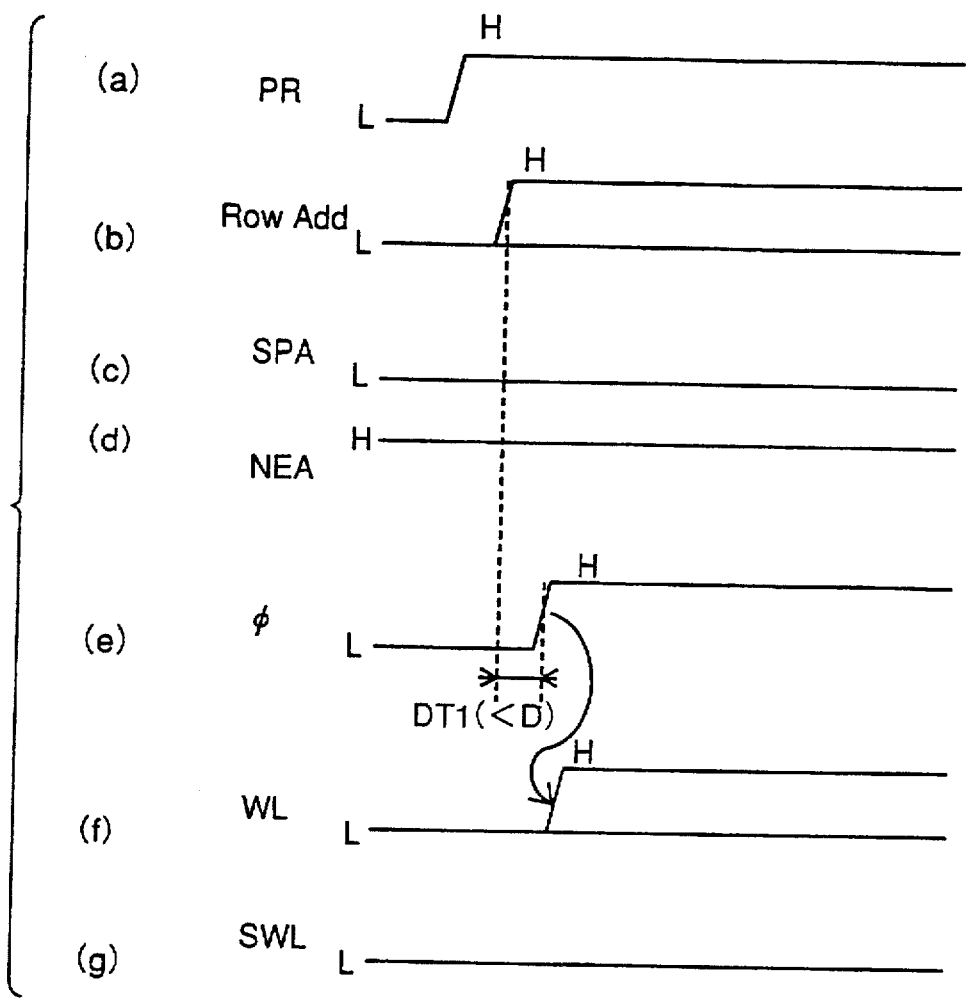
FIGS. 12(a)–12(g) are timing charts showing the operation of the semiconductor memory device shown in FIG. 1.

Next with reference to the timing chart of FIG. 12, the operation of the semiconductor memory device when it does not use row redundant circuit SR is described. When row redundant circuit SR is not used, SW7 is switched by signal RUSE of low level output from row-related determining circuit 262, so that the supply voltage is applied to the gate of P channel MOS transistor Q1. Signal RUSE also switches SW8 to apply the supply voltage to the gate of N channel MOS transistor Q3. Accordingly, P channel MOS transistor Q1 turns off and N channel MOS transistor Q3 turns on when row redundant circuit SR is not used. As shown by (c) and (g) of FIG. 12, spare word line SWL is never activated since the level of signal SPA output from row fuse programming circuit RFC is always fixed at low (L) and the low level signal SPA is input to one of spare row decoders 6 constituted by AND circuits. At this time, the level of signal NEA output from row decoder control circuit 2 constituted by an NOR circuit is fixed at high (H) as shown by FIG. 12(d). Therefore, word line WL can be activated earlier by realizing the earlier activation of decoder activation signal φ, because row decoder 4, which inputs internal row address signal RowAdd after the activation of precharge signal PR, waits for the input of the activated decoder activation signal φ to activate word line WL as shown by (a), (b), (e) and (f) of FIG. 12. In this case, in order to allow decoder activation signal φ to activate earlier, SW2 is switched by signal RUSE of low level output from row-related determining circuit 262, and decoder activation signal φ is delayed in delay circuit DC1 with delay time DT1 (<DT) set therein.

Using row fuse programming circuit RFC, the acceleration of the data access is possible since signal SPA of low level is output without the comparison between the defective address and the internal row address when the use of row redundant circuit SR is unnecessary. Further, the reduction of the power consumption is possible by avoiding the charge/discharge current through output node N1.

Figure 13:
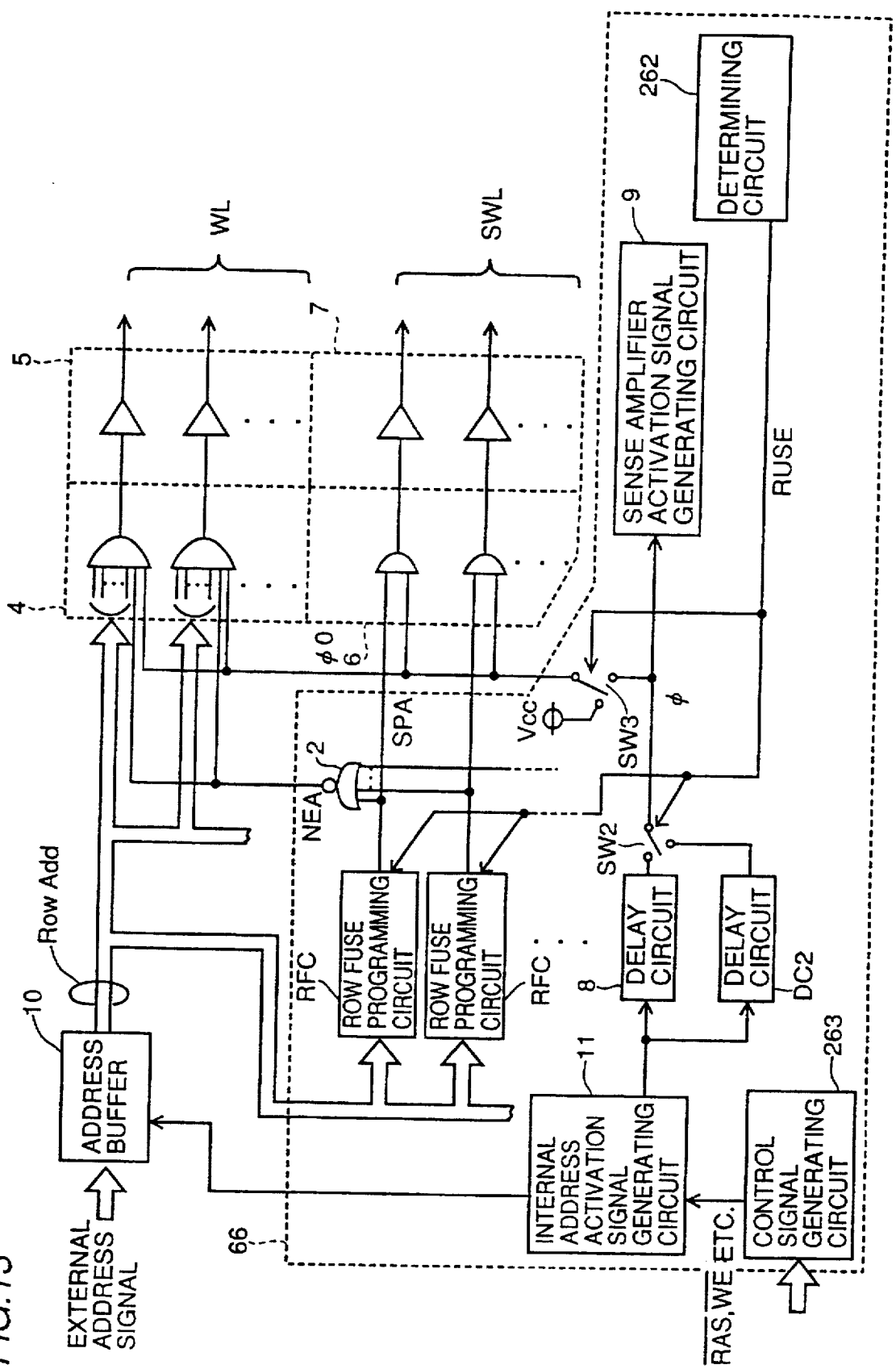
FIG. 13 shows the structure of the improved version of the row-related decoder control portion shown in FIG. 1.

Referring to FIG. 13, the structure of a row-related decoder control portion 66 which is the improved version of row-related decoder control portion 26 shown in FIG. 10.

Figure 14:
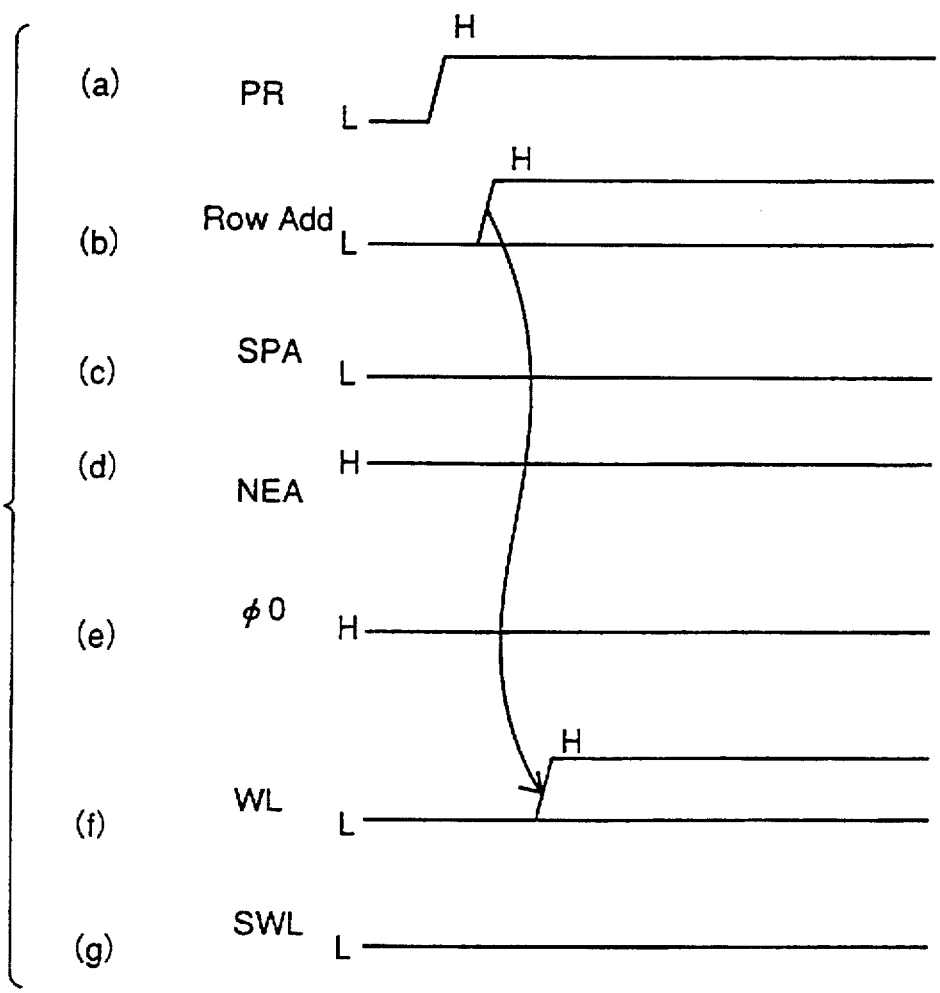
FIGS. 14(a)–14(g) are timing charts showing the operation of the semiconductor memory device provided with the row-related decoder control portion in FIG. 13.

As shown in FIG. 13, row-related decoder control portion 66 is structured similarly to row-related decoder control portion 26 in FIG. 10 except that it is further provided with switch SW3 connected between switch SW2 and spare row decoder 6/row decoder 4. SW3 is switched by signal RUSE output from row-related determining circuit 262 to connect switch SW2 with spare row decoder 6 and row decoder 4 when row redundant circuit SR is used, and connect supply node Vcc with spare row decoder 6 and row decoder 4 when SR is not used. (The level of decoder activation signal φ0 is set high (H).) FIG. 14 shows the timing of operation of the semiconductor memory device having row-related decoder control portion 66 when row redundant circuit SR is not used.

In this case, decoder activation signal φ0 shown by FIG. 14(e) with its level fixed high is input from switch SW3 to row decoder 4 and spare row decoder 6, then row decoder 4 activates word line WL by inputting internal row address signal RowAdd as shown by (b) and (f) of FIG. 14. Here the precharge signal PR, the signal SPA, the signal NEA and the spare word line SWL shown in FIGS. 14(a), 14(c), 14(d) and 14 (g), respectively, are related in the same way as those shown in FIGS. 12(a), 12(c), 12(d) and 12(g). Row-related decoder control portion 66 thus operates similarly to decoder control portion 26 shown in FIG. 10 when row redundant circuit SR is used. On the other hand, when row redundant circuit SR is not in use, the power consumption in row fuse programming circuit RFC can be reduced and the data access is further accelerated.

Next, the description of column-related decoder control portion 28 included in the semiconductor memory device according to the embodiment of the present invention is presented.

Referring to FIG. 1, column-related decoder control portion 28 includes: a column fuse programming portion 281 for comparing the previously stored defective column address corresponding to the defective memory cell with the column address represented by the input internal column address signal; a column decoder control circuit 283 for activating column decoder 22 in accordance with a signal SPAC output from column fuse programming portion 281; a column-related determining circuit 282 having the structure similar to that of row-related determining circuit 262 in FIG. 3 for indicating whether the semiconductor memory device uses column redundant circuit SC or not; delay circuit DC3 which delays a decoder activation signal φc for delay time DT2; a delay circuit DC4 connected in parallel with delay circuit DC3 for delaying decoder activation signal φc for delay time DT3 which is shorter than delay time DT2; and a switch SW9 for switching the delay of decoder activation signal φc in delay circuit DC3 and the delay in delay circuit DC4 according to a signal CUSE output from column-related determining circuit 282.

It is thus understood that column-related decoder control portion 28 has a structure similar to that of row-related decoder control portion 26. The structure is illustrated in FIG. 15 in more detail.

Figure 15:
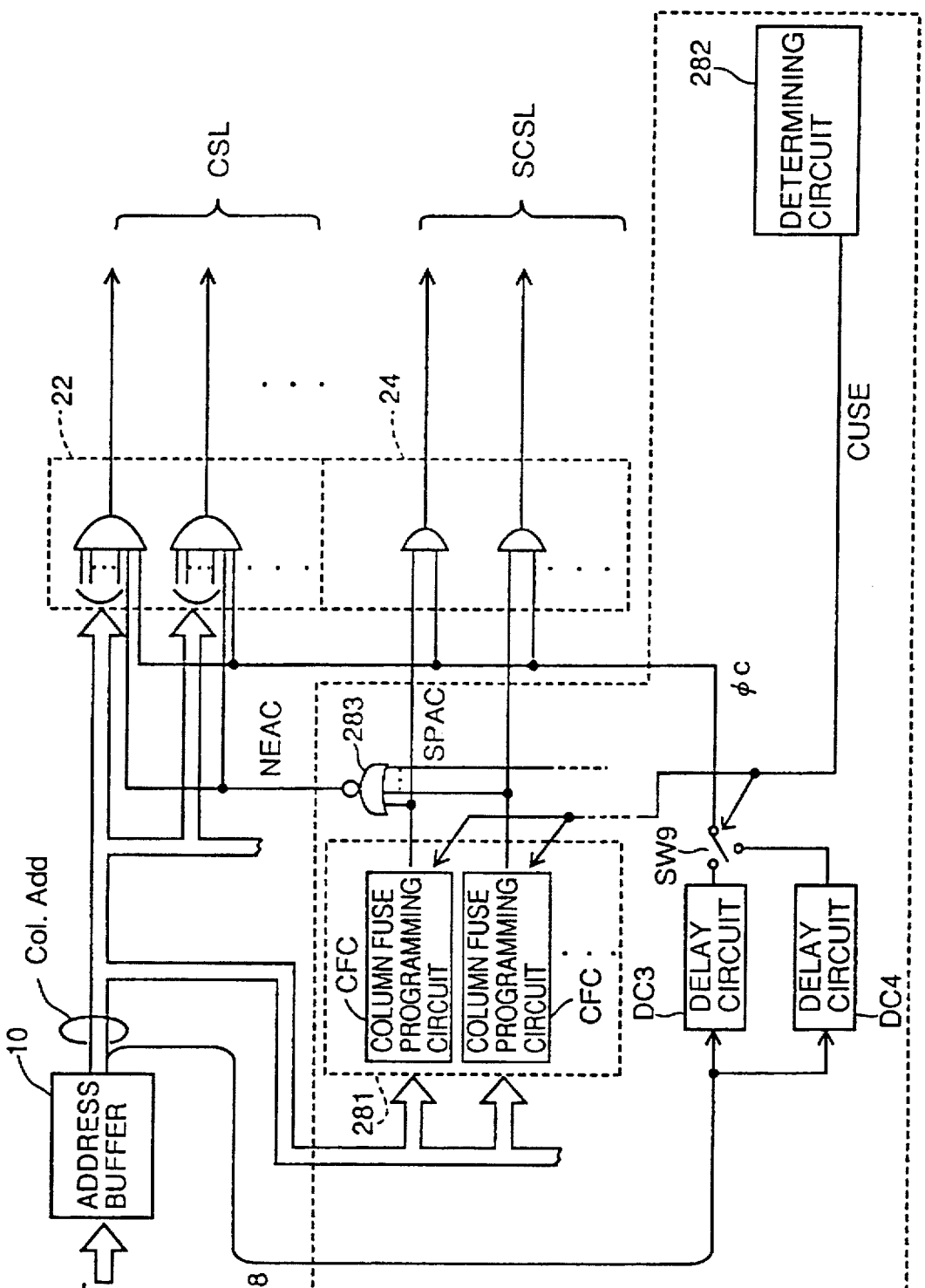
FIG. 15 shows the structure of the column-related decoder control portion shown in FIG. 1.
Figure 16:
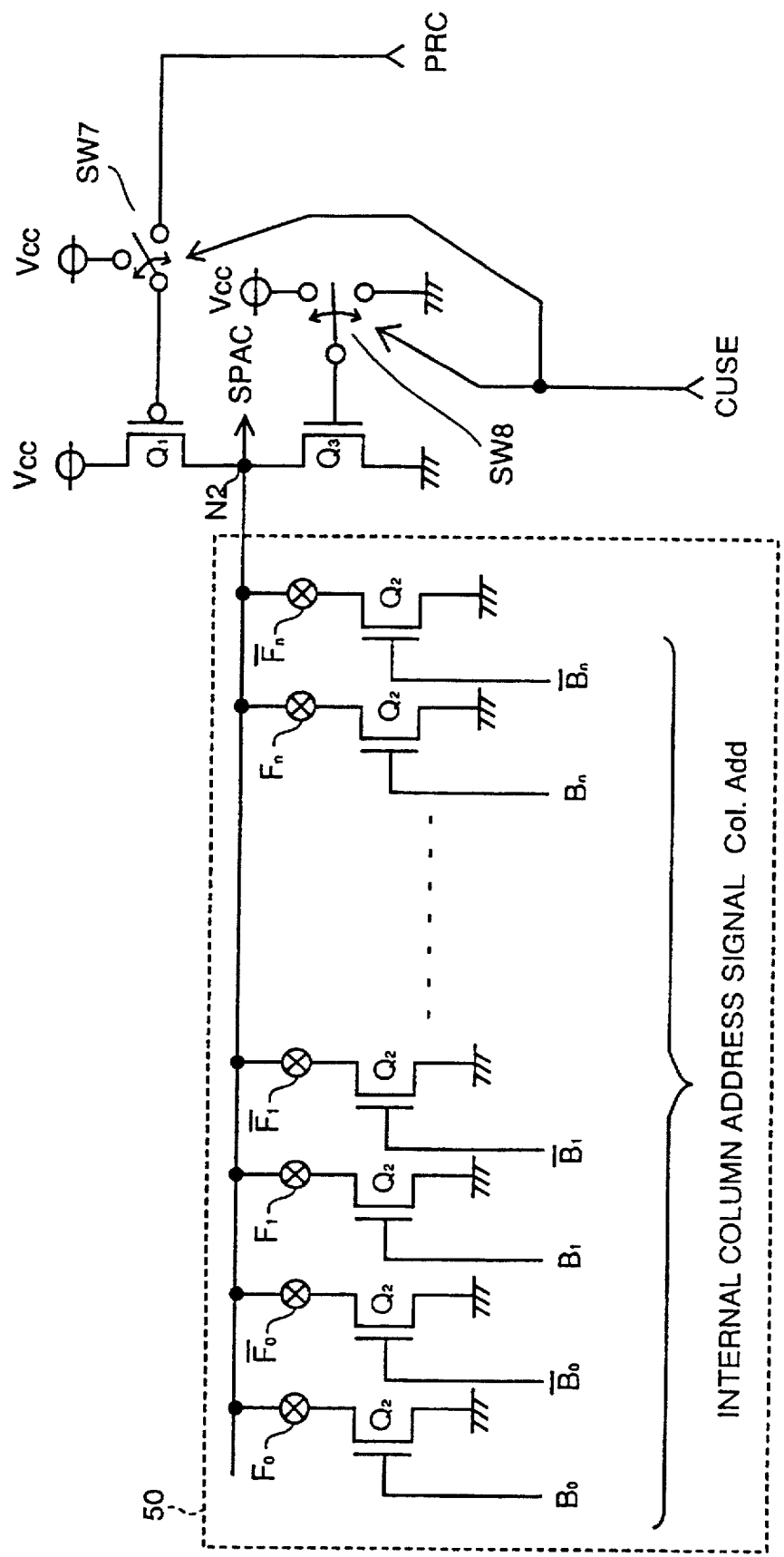
FIG. 16 is a circuit diagram showing the structure of the column fuse programming circuit in FIG. 15.

Referring to FIG. 16, the circuit structure of a column fuse programming circuit CFC shown in FIG. 15 is illustrated. As shown in FIG. 16, column fuse programming circuit CFC is structured similarly to row fuse programming circuit RFC in FIG. 11, and the defective address previously stored in a column address comparison portion 50 is compared with column addresses Bx, $\overline{Bx}$ (x=0–n) represented by internal column address signal Col.Add.

Next the operation of the semiconductor memory device provided with column-related decoder control portion 28 is described. The operation, similar to that of the semiconductor memory device including row-related decoder control portion 26, is hereinafter explained specifically.

Figure 17:
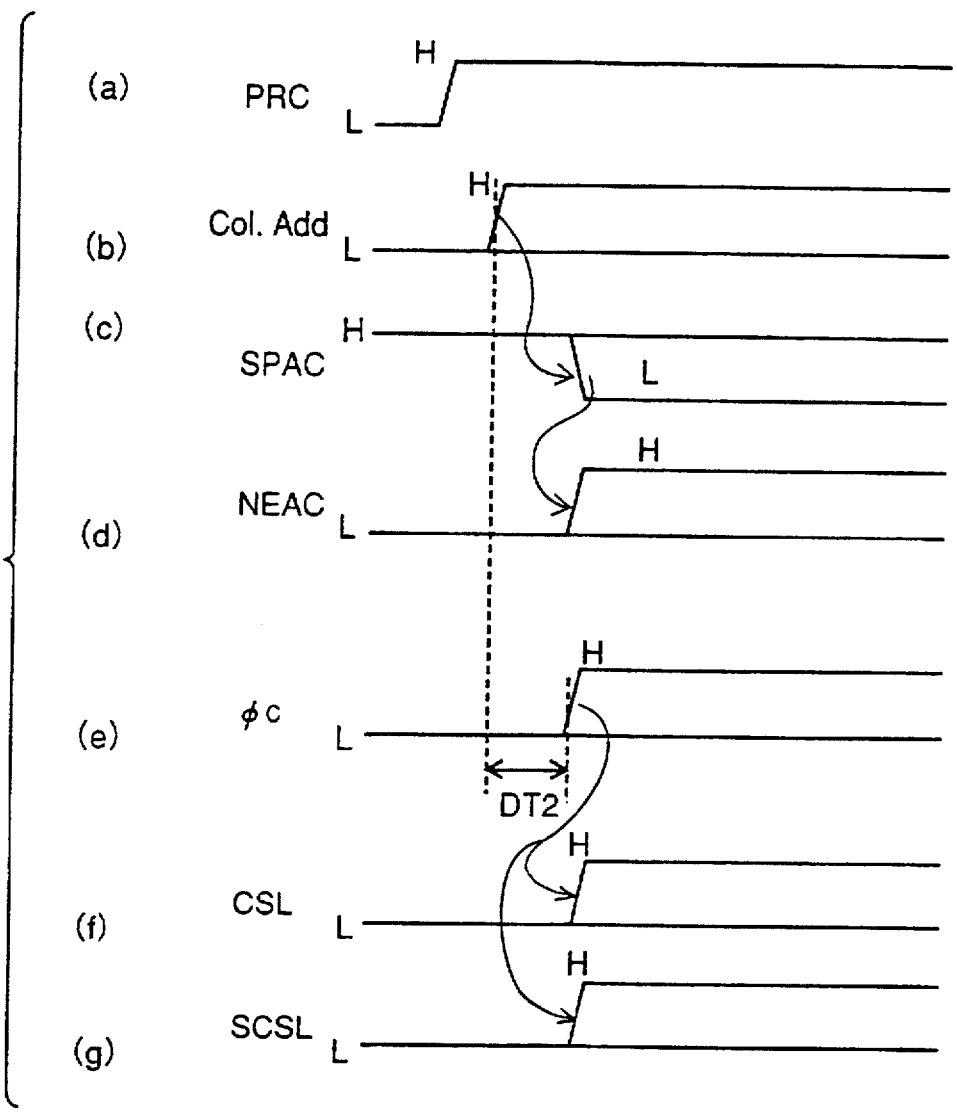
FIGS. 17(a)–17(g) are timing charts showing the operation of the semiconductor memory device provided with the column-related decoder control portion in FIG. 15 when the column redundant circuit is used.

FIG. 17 is a timing chart showing the operation when column redundant circuit SC is in use. When column redundant circuit SC is used, signal CUSE of high level output from column-related determining circuit 282 switches SW7 and SW8 to supply the gate of P channel MOS transistor Q1 with precharge signal PRC of low level shown in FIG. 17(a) output from a precharge signal generating circuit (not shown), and to supply the gate of N channel MOS transistor Q3 with the ground voltage. The level of signal SPAC output from column fuse programming portion 281 is accordingly set high (H) as shown by FIG. 17(c). The level of a signal NEAC output from column decoder control circuit 283 constituted by an NOR circuit is set low (L) as shown By FIG. 17(d). At this time, SW9 shown in FIG. 15 is switched by the high level signal CUSE output from column-related determining circuit 282, and decoder activation signal φc is output to column decoder 22 and spare column decoder 24 with delay time DT2 from the time when internal column address signal Col.Add is output from address buffer 10 as shown by (b) and (e) of FIG. 17. Delay time DT2 is determined based on the time which is required for the comparison between the defective column address and the internal column address by column fuse programming circuit CFC and for the determination of the level of signal SPAC output from column fuse programming circuit CFC and the level of signal NEAC generated in column decoder control circuit 283 according to signal SPAC.

Accordingly, both column select line CSL and spare column select line SCSL are not activated during the standby period, that is, prior to the output of internal column address signal Col.Add from address buffer 10. When the column address shown by the input internal column address signal Col.Add matches the detective address, the potential of output node N2 shown in FIG. 16 is maintained at high (H) level, and signal SPAC of high level is output from column fuse programming circuit CFC to activate decoder activation signal φc, resulting in the activation of spare column select line SCSL as shown by (e) and (g) of FIG. 17.

If the column address represented by the input internal column address signal Col.Add does not correspond to the defective address, the level of signal SPAC output from column fuse programming circuit CFC is set low (L), and the level of signal NEAC output from column decoder control circuit 283 to be supplied to column decoder 22 attains high (H) as shown in FIGS. 17(c), 17(d) and 17(e). Column select line CSL is accordingly activated by the input of the activated decoder activation signal φc to column decoder 22 as shown in FIG. 17(f).

Figure 18:
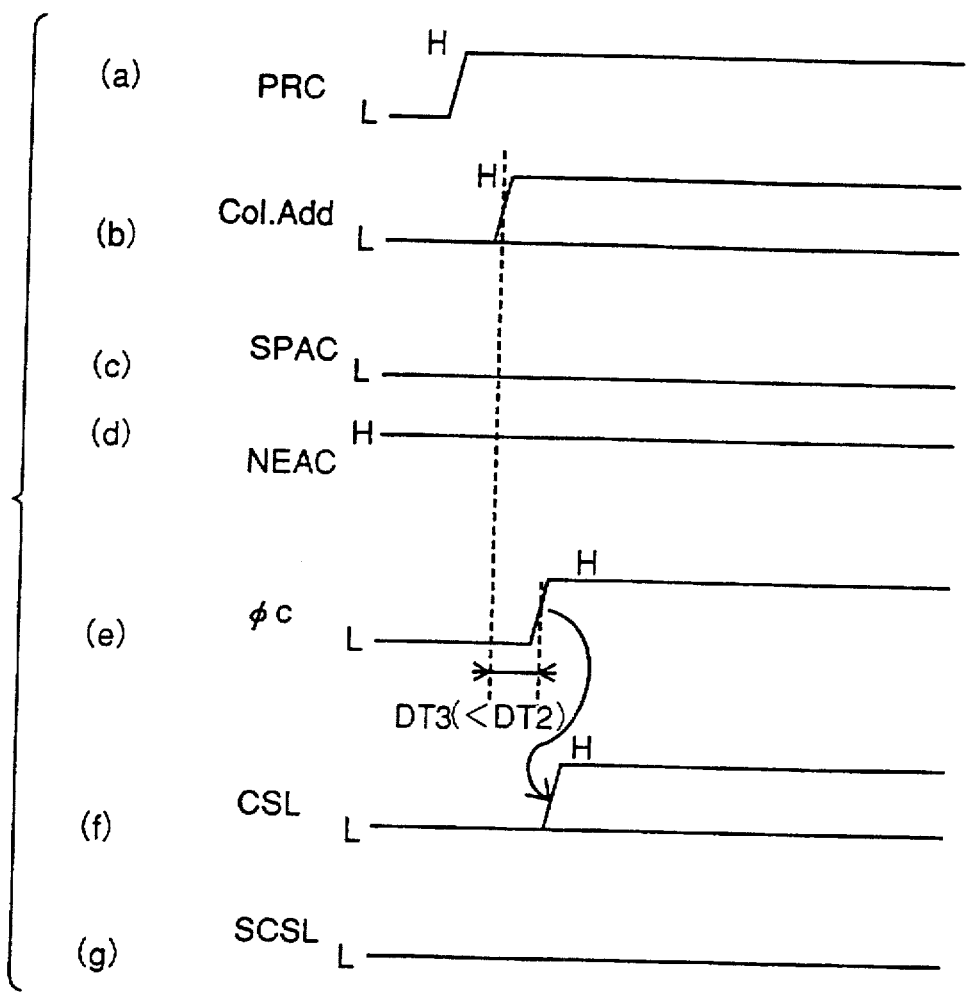
FIGS. 18(a)–18(g) are timing charts showing the operation of the semiconductor memory device provided with the column-related decoder control portion in FIG. 15 when the column redundant circuit is not used.
Figure 19:
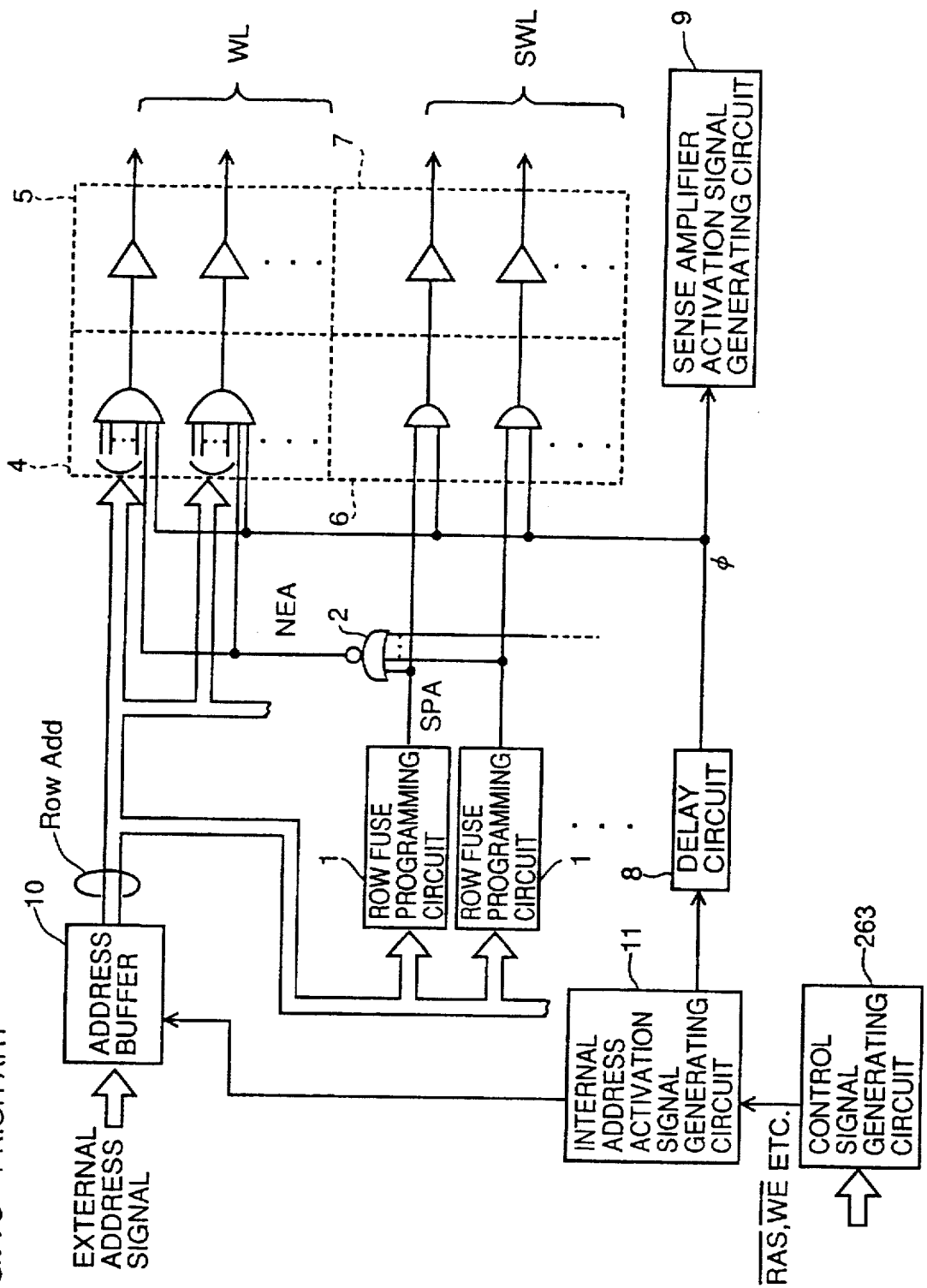
FIG. 19 shows the structure of the semiconductor memory device including a conventional row-related redundant circuit.

With reference to FIG. 18, the timing chart shows the operation when column redundant circuit SC is not used. When column redundant circuit SC is not in use, SW7 and SW8 shown in FIG. 16 and SW9 in FIG. 15 are switched by signal CUSE of low level output from column-related determining circuit 282, so that P channel MOS transistor Q1 and N channel MOS transistor Q3 shown in FIG. 16 respectively turn on and off to fix the level of signal SPAC output from column fuse programming circuit CFC at low (L) as shown in FIG. 18(c). The level of signal NEAC output from column decoder control circuit 283 constituted by an NOR circuit accordingly attains high (H) as shown by FIG. 18(d). As shown by (b), (e) and (f) of FIG. 18, column decoder 22 is not required to wait for signal NEAC output from fuse programming circuit CFC as is required when column redundant circuit SC is used, allowing earlier activation of column select line CSL, owing to the input of decoder activation signal φc delayed for delay time DT3 (<DT2) after the generation of internal column address signal Col.Add shown in FIG. 18(b) in delay circuit DC4 compared with the activation when column redundant circuit SC is used. The acceleration of the data access is thus realized. Here the relation between precharge signal PRC shown in FIG. 18(a) and internal column address Col.Add shown in FIG. 18(b) are the same as that between precharge signal PRC shown in FIG. 17(a) and internal column address Col.Add shown in FIG. 17(b). And, as shown in FIG. 18(g), the spare column select line SCSL is not selected in this case.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a plurality of memory cells storing data;

a redundant circuit used in place of a defective memory cell, if any, among said memory cells;

driver means for writing and reading data in said memory cells or said redundant circuit;

defective address storing means for comparing a previously stored defective address corresponding to said defective memory cell with an address represented by an input address signal to generate a comparison outcome signal; and a cell state demonstrating means for showing whether said redundant circuit is to be used or not, wherein said cell state demonstrating means deactivates said defective address storing means when the use of said redundant circuit is unnecessary.

2. The semiconductor memory device according to claim 1, wherein said defective address storing means outputs said comparison outcome signal which has the same logic level as that of said comparison outcome signal generated when said defective address does not match said address, without comparing said defective address with said address when said cell state demonstrating means shows that the use of said redundant circuit is unnecessary.

3. A semiconductor memory device, comprising:

a plurality of memory cells storing data;

a row redundant circuit used in place of a defective memory cell, if any, among said memory cells;

a plurality of word lines;

a spare word line;

a row decoder responsive to an input internal row address signal to activate the selected one of said word lines;

a spare row decoder activating said spare word line;

defective row address storing means for comparing a previously stored defective row address corresponding to said defective memory cell with a row address represented by said input internal row address signal to supply said spare row decoder with a comparison outcome signal of active state when these addresses match each other, and with a comparison outcome signal of non-active state when the addresses do not match each other; and cell state demonstrating means for showing whether the use of said row redundant circuit is necessary or not, wherein said defective row address storing means includes an output node for outputting said comparison outcome signal, row address comparison means connected to said output node, supply voltage supplying means for applying the supply voltage to said output node, and ground voltage supplying means for applying the ground voltage to said output node, wherein said ground voltage is applied to said output node by said ground voltage supplying means and said supply voltage is not applied to said output node by said supply voltage supplying means when said cell state demonstrating means shows that the use of said row redundant circuit is unnecessary, so that said comparison outcome signal of non-active state is output from said output node.

4. A semiconductor memory device, comprising:

a plurality of memory cells storing data;

a column redundant circuit used in place of a defective memory cell, if any, among said memory cells;

a plurality of column select lines;

a spare column select line;

a column decoder responsive to an input internal column address signal to activate the selected one of said column select lines;

a spare column decoder activating said spare column select line;

defective column address storing means for comparing a previously stored defective column address corresponding to said defective memory cell with a column address represented by said input internal column address signal to supply said spare column decoder with a comparison outcome signal of active state when these addresses match each other, and with a comparison outcome signal of non-active state when the addresses do not match each other; and cell state demonstrating means for showing whether the use of said column redundant circuit is necessary or not, wherein said defective column address storing means includes an output node for outputting said comparison outcome signal, column address comparison means connected to said output node, supply voltage supplying means for applying the supply voltage to said output node, and ground voltage supplying means for applying the ground voltage to said output node, wherein said ground voltage is applied to said output node by said ground voltage supplying means and said supply voltage is not applied to said output node by said supply voltage supplying means when said cell state demonstrating means shows that the use of said column redundant circuit is unnecessary, so that said comparison outcome signal of non-active state is output from said output node.

5. A semiconductor memory device comprising:

a plurality of normal groups each including a plurality of memory cells;

a spare group including a plurality of spare memory cells and being replaceable one of said plurality of normal groups;

a determining circuit for generating a redundant use signal indicating whether said spare group replaces one of said plurality of normal groups or not;

address programming means for programming an address corresponding to said one of said plurality of normal groups replaced by said spare group and for generating a spare enable signal being for indicating that said address identifies with an address designated by an input address signal;

a selecting circuit activated in response to said spare enable signal and an activation signal, said selecting circuit in response to the input address signal for selecting a group among said plurality of normal groups; and activating means in response to said redundant use signal for generating said activation signal and activating said selecting circuit earlier when said redundant use signal does not indicate that said spare group replaces one of said plurality of normal groups than when said redundant use signal indicates that said spare group replaces one of said plurality of normal groups.

6. The semiconductor memory device according to claim 5, wherein said plurality of memory cells included in said plurality of normal groups are arranged in a plurality of rows, each of said plurality of normal groups includes respective one of said rows of memory cells, and said plurality of spare memory cells are arranged in a row.

7. The semiconductor memory device according to claim 5, wherein said plurality of memory cells included in said plurality of normal groups are arranged in a plurality of columns, each of said plurality of normal groups includes respective one of said columns of memory cells, and said plurality of spare memory cells are arranged in a column.

8. The semiconductor memory device according to claim 5, wherein
said spare enable signal attains a logic level indicating that said address programmed by said address programming means does not identify with the address designated by the input address signal when said redundant use signal does not indicate that said spare group replaces one of said plurality of normal groups.

9. The semiconductor memory device according to claim 5, wherein
said activating means includes:
a master activation signal generating circuit generating a master activation signal; and
delay means for delaying said master activation signal and generating said activation signal, a delay time of said delay means when said redundant use signal does not indicate that said spare group replaces one of said plurality of normal groups being shorter than a delay time of said delay means when said redundant use signal indicates that said spare group replaces one of said plurality of normal groups.

10. The semiconductor memory device according to claim 5, wherein
said activating means includes:
a master activation signal generating circuit generating a master activation signal;
a first delay circuit receiving said master activation signal and generating a first signal with a first delay time;
a second delay circuit receiving said master activation signal and generating a second signal with a second delay time shorter than the first delay time; and
a switch circuit, in response to said redundant use signal, selecting one of said first and second signals and generating said activation signal corresponding to the selected one of said first and second signals.

11. The semiconductor memory device according to claim 5, wherein
said address programming means includes:
a programming circuit; and
a switch circuit connected to an output of said programming circuit and a potential having a logic level, said spare enable signal being responsive to an output of said switch circuit.

12. The semiconductor memory device according to claim 5, wherein
said address programming means includes:
a plurality of address programming unit each including a fuse and a transistor coupling between a node and ground, the transistor receiving a corresponding bit of a plurality of bits included in the input address signal;
a precharge transistor coupled between a power supply and said node, and rendered non-conductive in response to said redundant use signal; and
a discharge transistor coupled between said node and ground, and rendered conductive in response to said redundant use signal, and wherein
said spare enable signal is responsive to a potential of said node.

13. The semiconductor memory device according to claim 5, further comprising:
a sense amplifier activation signal generating circuit receiving said activation signal.

* * * * *